United States Patent [19]

Wesseling et al.

[11] Patent Number: 5,656,339

[45] Date of Patent: Aug. 12, 1997

[54] METHOD OF AND ARRANGEMENT FOR APPLYING A FLUID TO A SURFACE USING A VIBRATING NEEDLE

[75] Inventors: Wessel J. Wesseling; Nicolaas J. A. Van Veen, both of Eindhoven, Netherlands

[73] Assignee: U.S. Philips Corporation, New York, N.Y.

[21] Appl. No.: 492,830

[22] Filed: Jun. 20, 1995

[30] Foreign Application Priority Data

Jun. 20, 1994 [EP] European Pat. Off. .............. 94201755

[51] Int. Cl.$^6$ ...................................................... B06B 1/06
[52] U.S. Cl. .................... 427/600; 239/101; 239/102.1; 239/102.2
[58] Field of Search ............................. 427/600; 239/101, 239/102.1, 102.2; 222/196, 199

[56] References Cited

U.S. PATENT DOCUMENTS 4,828,886  5/1989  Hieber .................................. 239/102.2

FOREIGN PATENT DOCUMENTS 3728054  3/1989  Germany .

*Primary Examiner*—Katherine A. Bareford
*Attorney, Agent, or Firm*—Norman N. Spain

[57] ABSTRACT

The invention relates to a method of applying a fluid (12) to a surface (13), the pressurised fluid being applied from a container (1) to the surface via a hollow needle (7). In order to preclude clogging of the needle the needle is subjected to a longitudinal vibration during the application of fluid. The invention also relates to an arrangement for carrying out the method, the arrangement comprising a vibration device (3), such as a piezoelectric transducer, which can be coupled to the needle (7) to set the needle into longitudinal vibration. The fluid may be, for example, a solder paste or an adhesive.

13 Claims, 2 Drawing Sheets

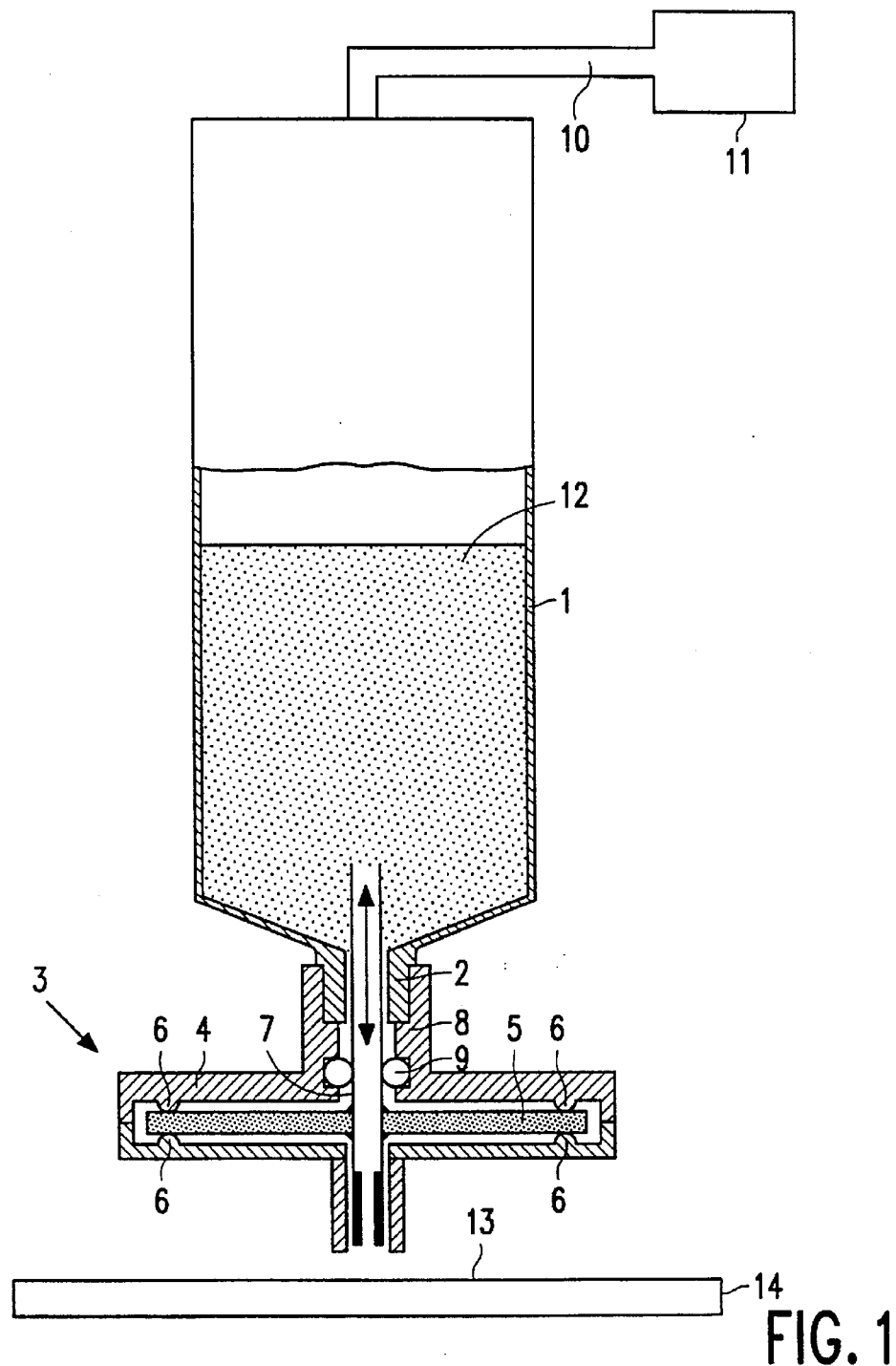
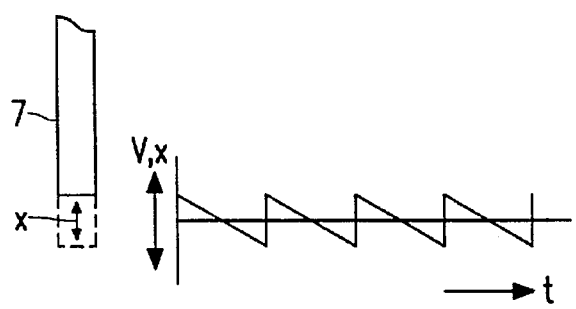
FIG. 1
FIG. 2

METHOD OF AND ARRANGEMENT FOR APPLYING A FLUID TO A SURFACE USING A VIBRATING NEEDLE

BACKGROUND OF THE INVENTION

The invention relates to a method of applying a fluid to a surface, the pressurised fluid being applied from a container to the surface through a hollow needle. The invention also relates to an arrangement for carrying out said method.

Such a method is known from DE-A-37 28 054.

A frequently occurring problem with this known method is clogging of the hollow needle. When the fluid is a solder paste clogging is caused particularly by segregation of the solder paste near the transition from the container to the needle. The flux then separates from the soldering powder globules because the specific mass of the soldering powder globules is higher than that of the flux. This results in solder powder globules accumulating in the lower part of the container and thereby obstructing the entrance to the needle. When the paste is subjected to pressure impulses in order to apply the paste, the solder powder globules are compressed additionally, which promotes the clogging process. When the fluid is an adhesive, clogging is caused by premature curing of the adhesive, particularly because pressure pulses cause a rise in temperature. The pressure to which the fluid is subjected may result merely from the hydrostatic pressure of the fluid itself or, in addition, an external pressure produced by separate pressure means.

SUMMARY OF THE INVENTION

It is an object of the invention to preclude clogging of the hollow needle, as far as this is possible.

To this end the method in accordance with the invention is characterised in that the needle is subjected to a vibration along it longitudinal axis during fine application of fluid.

It has been found that when the needle vibrates in the above-mentioned manner the homogeneous distribution of the fluid components remains satisfactory. The fluid better retains its state of fluidity. A homogeneous distribution prevents clogging of the needle, as a result of which the process need not be interrupted to clean or replace the needle.

A variant of the above method is characterised in that the needle is subjected to a vibration having a frequency between 1 and 100 Hz and the duration of the needle movement towards the surface is longer than the duration of the needle movement away from the surface. As a result, the fluid is subjected to a pumping action directed towards the surface to which the fluid is applied. Applying the fluid to the surface can even be effected exclusively by means of the pumping action described above. When external pressure is applied the pumping action allows this pressure to be smaller than in the case that the needle is not subjected to a longitudinal vibration. When the above method is used for the application of a solder paste to a surface, the vibration amplitude is preferably of the same order of magnitude as the grain size of solder globules in the paste. This enables solder globules to be applied one by one.

Another variant of the method is characterised in that the needle is subjected to a vibration having a frequency between 1 and 30 kHz. At these high frequencies the fluid in the needle cannot follow the needle movements owing to the mass inertia. This reduces the friction between the needle and the fluid, as a result of which the output per unit of time is increased.

When the method is used for applying solder paste to a surface the vibration amplitude is preferably of the same order of magnitude as the grain size of the solder globules in the paste.

An arrangement for applying a fluid to a surface, comprising a hollow needle via which, in operation, the pressurised fluid is applied to the surface, is characterised in that the arrangement comprises a vibration device arranged to be coupled to the needle so as to make the needle vibrate longitudinally.

Preferably, the vibration device comprises a piezoelectric transducer connected to the needle. This enables the needle to be set into vibration in a constructionally simple manner. Obviously, other vibration devices are possible, such as electromagnetic or mechanical transducers.

BRIEF DESCRIPTION OF THE DRAWING

In the drawings:

FIG. 1 shows an arrangement for applying solder paste to a surface of a printed circuit board, FIG. 2 represents diagrammatically the movement of the needle when this needle vibrates with a low frequency and the piezoelectric transducer is modulated with a sawtooth voltage.

DETAILED DESCRIPTION OF THE INVENTION

Figure 3:
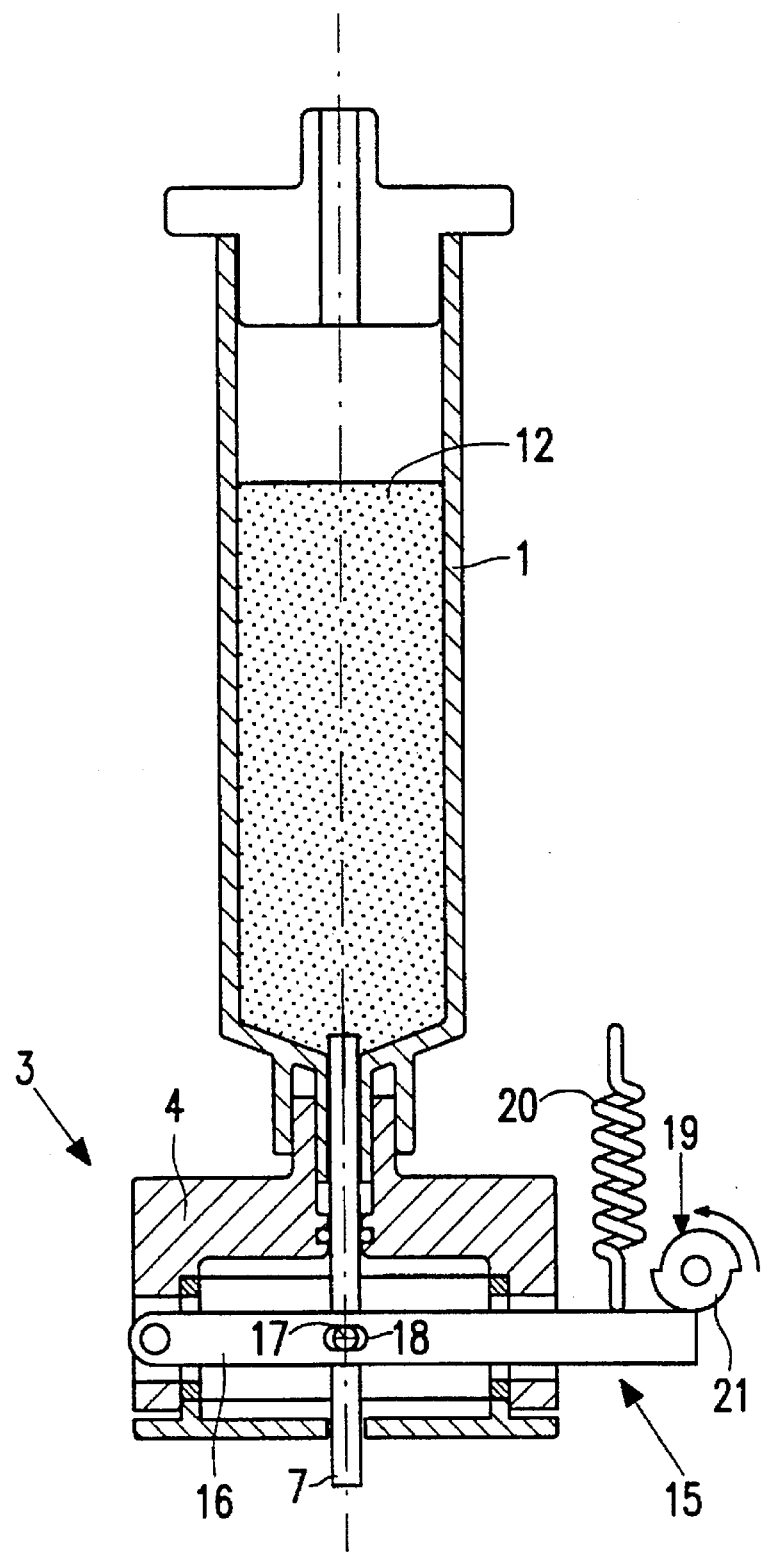
FIG. 3 shows another arrangement for applying solder paste to a surface of a printed circuit board.

The invention will now be described in greater detail with reference to the figures of the drawings.

The arrangement with which the method is carried out comprises a container 1 having an outlet 2. The vibration device 3 has a housing 4, which accommodates a piezoelectric transducer 5. This transducer comprises a flat disc whose edge is clamped between housing portions 6. A hollow needle 7 extends through the centre of the disc and perpendicularly to the disc. The needle is fixedly connected to the disc. The housing 4 has a connecting sleeve 8 by which the housing can be secured to the outlet 2 of the container 1, for example by screw-thread means. When the housing is disposed on the container the hollow needle extends through the outlet 2 into the container. A sealing ring 9 is interposed between the housing and the hollow needle. A tube 10 connects the container to a pressure generator 11.

The arrangement operates as follows:

Under the influence of pressure the solder paste 12 in the container is forced through the hollow needle 7 and is applied to a surface 13 of a printed circuit board 14. The pressure is generally applied in a pulsating fashion. During the application of the paste the piezoelectric transducer 5 is set into vibration by a voltage, causing the hollow needle 7 to vibrate in its longitudinal direction.

If the needle vibrates with a comparatively low frequency (1–100 Hz), the voltage can be modulated in such a manner that the needle moves slowly towards the surface and returns rapidly. This can be achieved by means of a sawtooth voltage. In this way the paste is subjected to a pumping action which facilitates the application of the paste. This is illustrated diagrammatically by means of FIG. 2. If the needle vibrates with a comparatively high frequency (1–30 kHz) the solder paste in the needle cannot follow the rapid movements of the needle. Satisfactory results are also obtained with a frequency of 6–7 kHz, a pressure on the paste of 0.5 bar, and a needle diameter of 0.2 mm. The paste output is approximately 40% higher than when the needle is not vibrated. For a further improvement of the pumping effect a needle vibrating at high frequency may be combined with a sawtooth vibration as described above.

FIG. 3 shows another vibration device. In this Figure like parts bear the same reference numerals as in FIG. 1. In the present embodiment the needle 7 is subjected to a low-frequency longitudinal vibration by means of a cam mechanism 15. An arm 16 is pivotally connected to the housing 4 of the vibration device 3. The needle 7 has a pin 17 engaging an opening 18 in the arm. The arm 16 extends transversely of the needle 7. A rotating cam 19 sets the arm 16 and hence the needle 7 into longitudinal vibration. A spring 20 urges the arm 16 against the cam surface 21 of the cam. The cam surface can be chosen in such a manner that the needle movement away from the surface of a printed circuit board is faster than needle movement towards this surface, which again produces said pumping action.

The pressure generator is preferably a fluid pump, for example an axial flow pump, because such a pump produces a well-defined pressure. However, an air-pressure pump is also possible. The pump may directly form part of the arrangement or may be external to this arrangement and be connected to the container via flexible tubes. The container may also be external and may be connected to the needle via a flexible tube. This reduces the overall mass of the moving system, enabling the speed to be increased.

We claim:

1. A method of applying a pressurized fluid to a surface, pressurized fluid being applied from a container to the surface through a hollow needle, wherein the needle is subjected to a vibration in the direction of its longitudinal axis during the application of the fluid.

2. A method as claimed in claim 1, wherein the needle is subjected to a vibration having a frequency between 1 and 100 Hz and durations of the needle movement towards the surface are longer than durations of the needle movement away from the surface.

3. A method as claimed in claim 2, in which the fluid is a solder paste, and the vibration has an amplitude of the same order of magnitude as solder globule grain sizes in the paste.

4. A method as claimed in claim 1, wherein the needle is subjected to a vibration having a frequency between 1 and 30 kHz.

5. A method as claimed in claim 1, wherein the fluid is subjected to a pulsating pressure concurrently with the needle vibration.

6. An arrangement for applying pressurized fluid to a surface comprising a hollow needle via which, in operation, the pressurized fluid is applied to the surface, wherein the arrangement comprises a vibration device coupled to the needle to make the needle vibrate in the direction of its longitudinal axis.

7. An arrangement as claimed in claim 6, wherein the vibration device comprises a piezoelectric transducer connected to the needle.

8. An arrangement as claimed in claim 7 wherein pressure means are provided for pressurizing the fluid in a container.

9. An arrangement as claimed in claim 7, wherein the piezoelectric transducer is driven by a voltage having a frequency of between 1 and 100 Hz, the amplitude of the voltage varying between two extreme values, the duration between the low value and the high value differing from the duration between the high value and low value.

10. An arrangement as claimed in claim 9 wherein pressure means are provided for pressurizing the fluid in a container.

11. An arrangement as claimed in claim 6, wherein the vibration device comprises a cam mechanism.

12. An arrangement as claimed in claim 11 wherein pressure means are provided for pressurizing the fluid in a container.

13. An arrangement as claimed in claim 6 wherein pressure means are provided for pressurizing the fluid in a container.

* * * * *